United States Patent [19] [11] 4,019,136
Wenz [45] Apr. 19, 1977

[54] PROCESS AND APPARATUS FOR DIGITAL INDICATION OF ELECTRIC MEASURING AND/OR TEST VALUES

[75] Inventor: Friedrich Wenz, Seeheim, Germany
[73] Assignee: Gebr. Hofmann KG, Darmstadt, Germany
[22] Filed: Dec. 29, 1975
[21] Appl. No.: 645,303
[30] Foreign Application Priority Data
  Jan. 3, 1975  Germany ............ 2500154
[52] U.S. Cl. ................. 324/128; 324/99 D
[51] Int. Cl.² .............. G01R 1/20; G01R 17/06
[58] Field of Search .......... 324/128, 99 D, 99 R; 340/347 AD; 235/152; 328/132

[56] References Cited
UNITED STATES PATENTS

| 2,564,829 | 8/1951 | Bedford et al. | 328/132 |
| 3,638,001 | 1/1972 | Gordon | 324/99 D |
| 3,863,152 | 1/1975 | Wernitz | 324/128 |

Primary Examiner—Rudolph V. Rolinec
Assistant Examiner—Ernest F. Karlsen
Attorney, Agent, or Firm—Cushman, Darby & Cushman

[57] ABSTRACT

An electrical circuit for digitally displaying an input electrical signal to minimize fluctuations in the output and maximize the speed of response to changes in the input signal whereby the input signal is applied to a first low pass filter and a second low pass filter having both a lower threshold frequency and a slower response time to changes in the input signal than the first filter. The outputs of the two filters are applied to a differential amplifier to produce a differential signal which is applied via a pair of serially and oppositely connected Zener diodes to the output of the second filter, which is also connected to the digital display, to cause rapid response to signal changes. The frequency of a unijunction oscillator is also controlled by the differential signal to increase the measuring rate of the digital display whenever the input signal charges by more than a predetermined value.

6 Claims, 1 Drawing Figure

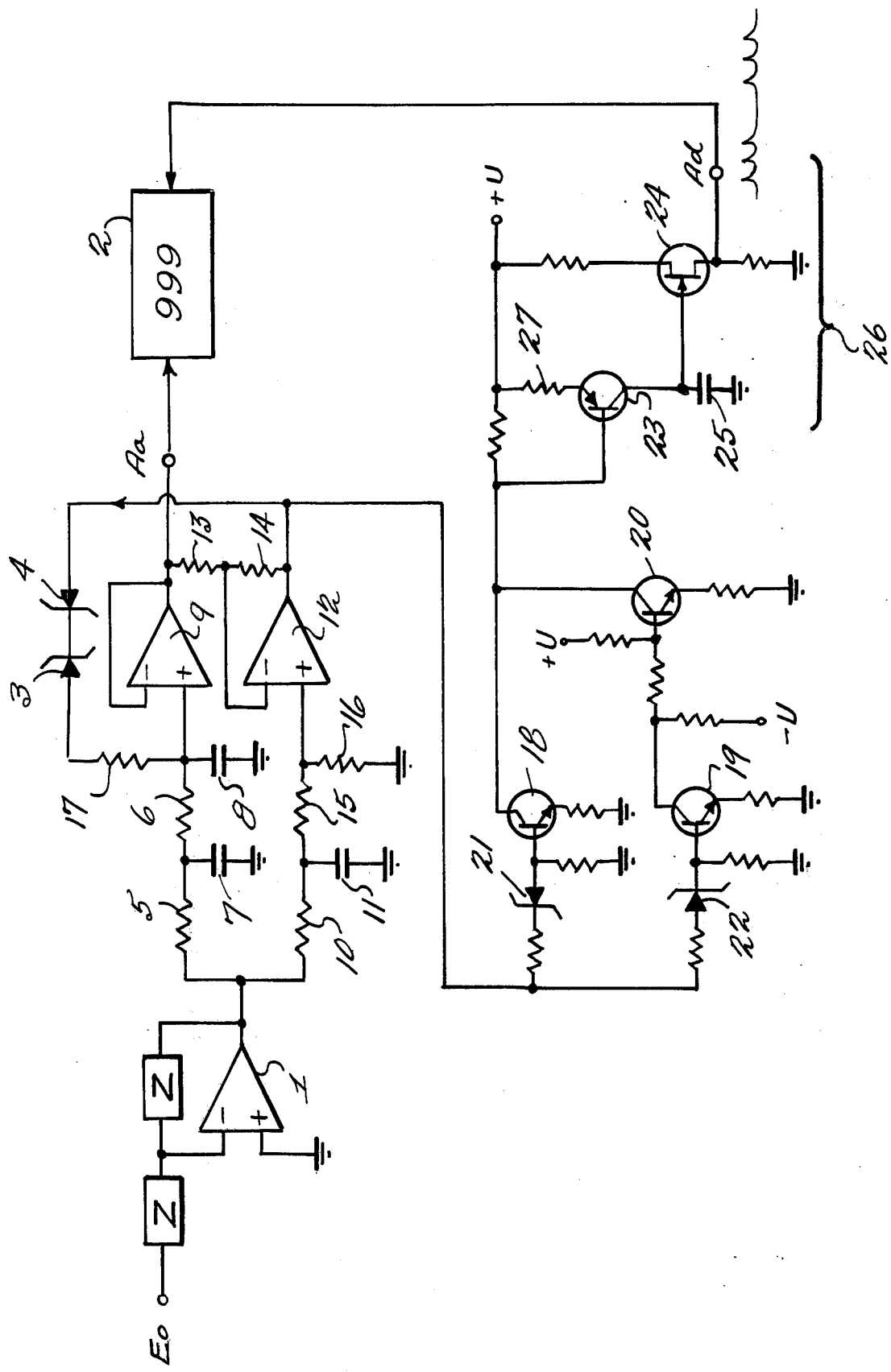

PROCESS AND APPARATUS FOR DIGITAL INDICATION OF ELECTRIC MEASURING AND/OR TEST VALUES

BACKGROUND OF THE INVENTION

The invention relates to a process and an electric circuit for digitally indicating electric measuring and/or test values.

It frequently turns out to be advantageous in many areas of engineering to indicate measuring and/or test values digitally. In recent times for indicating measuring and/or test values on test stands for tires, motors, vehicles, etc., the trend has been toward digital indication. Satisfactory commercial indicators, however, are still not available.

The difficulty with existing indicators is that periodic and stochastic small fluctuations are superimposed on the measured test values which are obtained. For analog devices such as those which have indicator needles which move in front of a scale, such fluctuations are largely averaged out through the inertia of the mass of the measuring mechanism whenever they are above the border frequency of the measuring mechanism. Furthermore, the impression for the observer is improved through the fact that indicator instruments have only a limited resolution capability, which is predetermined by the shaping of the pointers and the width of the marks of the scale. Slight fluctuations of the measuring values are thus reduced by the characteristics of the measuring mechanisms to an extent which imparts to the observer a "quiescent" appearing indication.

In the case of use of digital indicating devices, generally the demand is made that the resolution is to be at least equally as good, in most cases better than in the case of pointer instruments. A three digit indication of 000 to 999 cannot be avoided as a rule. Consequently fluctuations of the measuring value of only 0.1%0 will influence the last digit and fluctuations of measuring values of 1% will influence the last two digits. For the observer of the indicating arrangement this is unsettling since he finds it difficult to average out these digital changes, optically. In some cases this will even be impossible, since arithmetical operations would have to be carried out for this purpose. Moreover, the internal rate of the measuring cycle of the digital indicating instrument, e.g., a digital volt meter, is superposed on these fluctuations of the measuring values, that is to say the digital indicating instrument measures at points in time which are independent of the course of the fluctuations. As a result there develops a beat in the indication which makes it impossible for the observer to average at all.

In order to achieve a quite "flickerless" digital indication, it is necessary to average out the fluctuations of the measuring signals electronically. For this purpose, circuits are already obtainable commercially which smooth out the higher frequency portions by using low-pass filters. Whenever one also wishes to filter out fluctuations at lower frequencies, the threshold frequency of the low-pass filter must be reduced still further, which has a disturbing effect with regard to the build-up times, and adjusting times. The adjusting time of the low-pass filter arrangement increases with decreasing threshold frequency.

The consequence of this increase is that a relatively long time passes after lock-on of a measuring and/or test value on the digital indicating instrument, especially on digital volt meters, or else in the case of fluctuations of the measuring and/or test value in case of a change of testing conditions, until the digital indication changes to the new value. The digital volt meter behaves then just like an excessively strongly damped indicator measuring mechanism, i.e., the adjusting time is for most purposes unreasonably long. The disadvantage of periodic fluctuations of the indications have been largely avoided, but the price is a long adjusting time.

Therefore, it is an object of this invention to create a process and an electric circuit for the digital indication of measuring and/or test values which provides on the one hand a quasi-constant digital indication and on the other hand a short build-up time.

According to this invention, this object is achieved in that the electric signals corresponding to the measuring and/or test values are conducted simultaneously through the two channels, one of which has a higher adjusting time than the other, and are compared to one another simultaneously. In the case of a differential signal occurring because of a fluctuation of the measuring and/or test value, the signal appearing at the exit of the channel with the higher adjusting time and used for the indication is adjusted to the new measuring and/or test value quickly as a function of the differential signal.

In addition, it is advantageous if the rate of measurement of the indicating arrangement is increased in dependence on the differential signal which is obtained from the two outlets of the channels with variable adjusting time when strong fluctuations or jumps of the measuring and/or test values occur.

This is accomplished by an electric circuit for the digital indication of measuring and/or test values with a digital indication arrangement, especially a digital volt meter and a preceding low-pass filter whereby two low-pass filters with variable adjusting times are connected in parallel to the inlet for the measuring and/or test values. The outlets of the low-pass filters are coupled at a comparator circuit, the output of which is connected by way of a threshold value step circuit with the output of the low-pass filter with the higher adjusting time to which the inlet of the digital indicating arrangement is coupled.

The threshold value step circuit in this case can be adjusted in such a way, that in the case of slight fluctuations, the electric signal corresponding to the measuring and/or test values is connected only with the digital indicating arrangement by way of the low-pass filter with the higher adjusting time.

For this purpose the outlet of the comparator circuit can be connected with a capacitor at the output of the low-pass filter with the higher adjusting time, which delivers its charge to the digital indicating arrangement by way of the impedance transformer.

The comparator can be developed as a differential amplifier, the first input of which is connected with the output of the low-pass filter with the lower adjusting time, the second input of which is connected via the impedance transformer with the output of the low-pass filter with the higher adjusting time and the output of which is connected by way of Zener diodes to the capacitor at the inlet of the impedance transformer.

In order to raise the count rate of the digital indicator in response to particularly strong fluctuations or jumps of the electric measuring and/or test values, an electric circuit can be provided, by way of which the output of the comparator circuit drives the digital indicating arrangement, especially by way of a threshold value step. This driving circuit for the digital indicating arrangement can include a voltage controlled oscillator, the output signal of which constitutes the timing pulses for the digital indicator. The threshold value in this driving circuit can be made up of two Zener diodes connected in parallel, one of which is connected by way of an inverter with a common connecting point which is located at the input of the oscillator. Thus, in the case of a change in the signal because of a strong measuring and/or test value fluctuation or of a jump of this value, a short adjusting time is achieved and after the signal value has been brought to the new value, the adjusting time will be correspondingly higher so that an average which creates a smooth indication is produced. In other words, in the case of a strong change of the measuring and/or test value, the low-pass filter of the low order, respectively of high threshold frequency becomes effective and quickly pulls the signal value, which is used for the indication, to the new value and as soon as this new value is achieved, the low-pass filter with the high order, respectively a low threshold frequency, becomes active, by way of which then only the signals corresponding to the measuring respectively test values are fed on to the digital indicating arrangement.

As a result of the additional driving circuit, the measuring rate (indicating rate per unit of time) of the digital volt meter, respectively of the indicating arrangement can be controlled simultaneously in such a way, that with an approximately constant average value of the measuring value, there is a relatively long period of time between the two measurements and in the case of a signal jump, the measuring rate of the digital indicating arrangement is increased considerably so that the indication adjusts itself quickly to the new value and moreover the observer can recognize immediately, as a result of the raised sequence of indications on the indicating arrangement, that a jump in measuring value has occurred. Whenever the indication has steadied to the new value, the measuring rate, the indicating rate again becomes longer. Thus, an acceleration of the measuring rates or of the indicating rates is shown to the observer of the indicating arrangement, just as in the case of an indicator instrument in correspondence with the acceleration of the pointers in the case of jumps of the measuring value. This is a considerably improved aid for the observer as compared to the constant indication, respectively measuring rate, which merely shows the variable differences between the indicating values of successive measurements. The invention guarantees the avoiding of any shortcomings occurring in the case of the known digital indicating devices, which shortcomings have been described in the beginning and conveys to the observer an improved indication of the measurement.

Referring now to the FIGURE which illustrates a preferred embodiment of the invention, an input $E_o$ on which the measuring and/or test value that is to be indicated appears in the form of an electric signal.

Furthermore, the circuit shown contains a conventional operational amplifier 1, with suitable input and feedback impedances Z, which serve to adapt the input level of a signal $E_o$ to the input voltage range of the digital indicating arrangement, which in the FIGURE is a digital volt meter 2. Two low-pass filters connected in parallel follow the amplifier 1, one of which is developed as a passive low-pass filter of at least the second order and in the example shown consists of resistors 5 and 6, and capacitors 7 and 8. Connected to the output of this low-pass filter, is an operational amplifier functioning as an impedance transformer 9; the output of which is applied to digital volt meter 2.

The other low-pass filter is of at least a first order and in the example shown it consists of a resistor 10 and a capacitor 11. The low-pass filter consisting of resistor 10 and capacitor 11 is lower by one or several ordinal numbers than the low-pass filter consisting of the resistors 5 and 6 and the capacitors 7 and 8. The output of the lowpass filter comprising resistor 10 and capacitor 11 is connected to the plus input of an operational amplifier 12, which is connected especially as a differential amplifier. To the minus input of the amplifier 12, is connected the output of the impedance transformer 9 by way of a resistor 13. The resistor 13 and the resistor 14 as well as the resistors 10, 15 and 16 are dimensioned such, that in the case of an equal voltage between the output of the amplifier 1 and of the impedance transformer 9, no output voltage exists at the output of the amplifier 12.

Finally, the output of the amplifier 12 is connected via Zener diodes 3 and 4 and resistor 17 to capacitor 8 at the output of the low-pass filter with the lower threshold frequency and accordingly, the higher adjusting time. In order also, in the case of the digital volt meter 2, to influence the number of the measurements, respectively the number of indications per second, the following circuit has been provided additionally. This circuit is applied to the output of the amplifier 12 and has two Zener diodes 21 and 22 connected in parallel at its input. A transistor is connected in series to each of the Zener diodes, whereby an inverting followup transistor 20 follows the transistor 19. The collectors of the transistors 18 and 20 are applied to a common connecting point which lies at the input of a voltage controlled oscillator 26.

This voltage controlled oscillator 26 includes transistor 23 and unijunction transistor 24 as well as a resistor 27 and a capacitor 25. At the output Ad of the voltage controlled oscillator 26, there appears a timing signal which drives the digital voltage meter 2.

The method of operation of the circuit shown is as follows. Whenever a measuring, respectively test value that is to be indicated digitally appears in the form of an electric signal at the input E, the input level is adapted to the input voltage range of the digital volt meter 2, i.e., the amplitude of the signal is reduced to a value which corresponds to the full-scale deflection, or the amplitude is lowered to below the Zener voltage of the Zener diodes 3 and 4. The output signal of the amplifier 1 which is to be smoothed, passes the passive low-pass filter consisting of the resistors 5 and 6 and the capacitors 7 and 8 and is taken off in a smooth condition at the output of the impedance transformer 9 and fed to the digital voltage meter 2.

At the same time the signal that is to be smoothed also passes through the low-pass filter consisting of resistor 10 and capacitor 11, which is lower by one or several ordinal numbers than the above-mentioned low-pass filter and is applied to the plus input of the amplifier 12. If now a signal jump occurs at the input E, then it is desirable — as has already been mentioned — that as short a time as possible should pass until a stable condition again sets in at the output of the impedance transformer 9, i.e., until the output of the impedance transformer 9 is adjusted to the new signal value.

Since the low-pass filter consisting of the resistor 10 and the capacitor 11 has only a small ordinal number, and respectively a higher threshold frequency than the other low-pass filter, it builds up more quickly to the new value. During this shorter build-up time, a voltage difference exists at the inputs of the amplifier 12, which is magnified at the output of the amplifier 12. Whenever the Zener voltage of the Zener diodes 3 and 4 has been exceeded, then a current flows by way of the resistor 17 into the capacitor 8, which as a result is charged or discharged in an accelerated manner. The output of the impedance transformer 9 is thus adjusted to the new value in an accelerated manner. At the same time, the differential voltage at the inputs of the amplifier 12 decreases. In the case of an increased adaptation of the output of the impedance transformer 9 to the final value of the signal after the voltage jump, the output voltage of the amplifier 12 thus decreases until the Zener diodes 3 and 4 block conduction again. The signal appearing at the input E is then smoothed through the low-pass filter with resistors 5 and 6 and capacitors 7 and 8 and delivered to the digital volt meter 2. The speed of response is determined mainly by the low time constant of the lower low-pass filter comprising resistor 10 and capacitor 11, while the smoothing effect is determined by the lower threshold frequency of the upper low-pass filter comprising resistors 5 and 6 and capacitors 7 and 8. Whenever the differential signal at the output of the amplifier 12 is great upon occurrence of a signal jump, the Zener diodes 21 and 22 become conductive depending on the polarity of the output voltage on the amplifier 12. As a result of this, one of the transistors 18 or 19 is shifted to its conductive stage. Because of the inverting followup transistor 20, the connecting point of the collectors of the transistors 18 and 20 is always of low impedance toward the mass, whenever the Zener voltage of the Zener diodes 21 or 22 is exceeded. The transistors 23 and 24 form the voltage controlled oscillator 26, the frequency of which can be changed by the transistor 23, since the transistors 18 or 20 are more or less conductive. When transistors 18 and 20 are non-conductive, the oscillator 26 swings with a solid low frequency which is determined by the resistor 27 and the capacitor 25. In the case of a signal jump at the input E, i.e., in case of appearance of a differential signal at the output of the amplifier 12, the transistor 18 or the transistor 20 becomes conductive if the Zener voltage of one of the Zener diodes 21 and 22 is exceeded, as a result of which the transistor 23 also becomes conductive. This causes an increased charge in the capacitor 25, as a result of which the frequency of the oscillator 26 increases. The unijunction transistor 24 is applied to the control input for the indicating rate, respectively measuring rate of the digital volt meter 2, which releases a measuring process for every output impulse of the oscillator 26. The measuring rate of the digital volta meter 2 will thus always be increased whenever there is a large difference at the amplifier 12, i.e., whenever a signal jump takes place or just has taken place. In this manner, the measuring rate or the indicating rate of the indicating instrument 2 can be controlled depending on the speed of change of the occurring signal jump at the input E.

What is claimed is:

1. An electrical circuit for digitally displaying an input electrical signal comprising:
    a first low pass filter for receiving said signal and removing fluctuations therefrom, including an operational amplifier functioning as an impedance transformer,
    means for connecting the output of said first filter to digital display means,
    a second low pass filter for receiving said signal and removing fluctuations therefrom, said second filter having an adjusting time in response to changes in the value of said signal less than the adjusting time of said first filter,
    means for comparing the outputs of said first and second filters and producing an electrical signal indicating the difference including a differential amplifier with one input connected to the output of said operational amplifier and a second input connected to the output of said second filter,
    means for varying the output of said first filter in accordance with said difference so as to reduce said difference including first and second serially and oppositely connected Zener diodes connecting the output of said differential amplifier to the input to said operational amplifier.

2. A circuit as in claim 1 further including said display means which comprises a digital voltmeter.

3. A circuit as in claim 1 wherein said filters each include at least one serial connected resistor and at least one parallel connected capacitor.

4. A circuit as in claim 1 wherein said second filter has a higher threshold frequency than said first filter.

5. A circuit as in claim 1 further including said digital display means and including means for increasing the measuring rate of said display means whenever said difference is greater than a predetermined value.

6. A circuit as in claim 5 wherein said increasing means includes a unijunction oscillator connected to said display, said oscillator including a capacitor controlling the frequency of the output as a function of the charge thereon, said increasing means including a first transistor connected into a conductive path for charging said capacitor, second and third transistors connected to said first transistor for controlling conduction of said first transistor, and first and second oppositely directed Zener diodes connecting said second and third transistors to the output of said differential amplifier.

* * * * *